(12) United States Patent
Wojciechowski et al.

(10) Patent No.: US 9,824,932 B1
(45) Date of Patent: Nov. 21, 2017

(54) METHOD OF MAKING THERMALLY-ISOLATED SILICON-BASED INTEGRATED CIRCUITS

(71) Applicant: Sandia Corporation, Albuquerque, NM (US)

(72) Inventors: Kenneth Wojciechowski, Albuquerque, NM (US); Roy Olsson, Albuquerque, NM (US); Peggy J. Clews, Tijeras, NM (US); Todd Bauer, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/234,932

(22) Filed: Aug. 11, 2016

Related U.S. Application Data

(62) Division of application No. 13/959,136, filed on Aug. 5, 2013, now Pat. No. 9,646,874.

(51) Int. Cl.
*H01L 21/02* (2006.01)
*B81C 1/00* (2006.01)
(Continued)

(52) U.S. Cl.
CPC ........ *H01L 21/823481* (2013.01); *H01L 21/02178* (2013.01); *H01L 21/02532* (2013.01);
(Continued)

(58) Field of Classification Search
CPC ......... H01L 21/823481; H01L 21/3213; H01L 21/30604; H01L 21/84; H01L 21/762; H01L 21/31111; H01L 21/02178; H01L 21/02532; H01L 21/02592; H01L 21/764; H01L 23/34; H01L 2924/1461; B81C 2201/00–2201/117; B81C 2201/0198; B81C 2201/0156–2201/0159;
(Continued)

(56) References Cited

U.S. PATENT DOCUMENTS 6,458,615 B1 * 10/2002 Fedder ............ B81C 1/00246
216/79
7,344,907 B2    3/2008 Colgan et al.
(Continued)

OTHER PUBLICATIONS

Gitelman, L. et al., "CMOS-SOI-MEMS Transistor for Uncooled IR Imaging", IEEE Transactions on Electron Devices, vol. 56, No. 9, Sep. 2009, pp. 1935-1942.
(Continued)

*Primary Examiner* — Natalia Gondarenko
(74) *Attorney, Agent, or Firm* — Martin I. Finston

(57) ABSTRACT

Thermally isolated devices may be formed by performing a series of etches on a silicon-based substrate. As a result of the series of etches, silicon material may be removed from underneath a region of an integrated circuit (IC). The removal of the silicon material from underneath the IC forms a gap between remaining substrate and the integrated circuit, though the integrated circuit remains connected to the substrate via a support bar arrangement that suspends the integrated circuit over the substrate. The creation of this gap functions to release the device from the substrate and create a thermally-isolated integrated circuit.

5 Claims, 18 Drawing Sheets

(51) Int. Cl.
| | |
|---|---|
| *B81B 7/00* | (2006.01) |
| *H01L 21/8234* | (2006.01) |
| *H01L 21/311* | (2006.01) |
| *H01L 21/306* | (2006.01) |
| *H01L 21/84* | (2006.01) |
| *H01L 21/762* | (2006.01) |
| *H01L 21/3213* | (2006.01) |
| *H01L 21/764* | (2006.01) |
| *H01L 23/34* | (2006.01) |
| *H01L 21/48* | (2006.01) |
| *H01L 41/047* | (2006.01) |

(52) U.S. Cl.
CPC .. *H01L 21/02592* (2013.01); *H01L 21/30604* (2013.01); *H01L 21/31111* (2013.01); *H01L 21/3213* (2013.01); *H01L 21/762* (2013.01); *H01L 21/764* (2013.01); *H01L 21/84* (2013.01); *H01L 23/34* (2013.01)

(58) Field of Classification Search
CPC .. B81C 2201/0101–2201/016; B81C 1/00595; B81C 1/00587; B81C 1/00523–1/00571; B81C 1/00388–1/00634; B81C 1/0015; B81C 1/00103; B81C 2203/00–2203/0792; B81C 2203/0707–2203/0778; B81C 99/00–99/0095; B81C 1/00119; B81C 1/00095; B81C 1/00031; B81C 1/00023–1/00126; B81C 1/00246; B81C 1/0069; B81C 1/00698; B81C 1/0065–1/00682; B81C 1/00055–1/00087; B81C 1/00841–1/00857; B81C 1/00936; B81C 1/00944

USPC ....... 257/467, 401, 470, 577, 622, 468, 469, 257/415, 420, 428, 429; 438/400, 50–55
See application file for complete search history.

(56) References Cited

U.S. PATENT DOCUMENTS

| | | | |
|---|---|---|---|
| 7,514,760 | B1 | 4/2009 | Quevy et al. |
| 8,304,848 | B2 * | 11/2012 | Suzuki ...................... G01J 5/02 |
| | | | 257/429 |
| 8,669,823 | B1 | 3/2014 | Olsson et al. |
| 2002/0145489 | A1 | 10/2002 | Cornell et al. |
| 2003/0021571 | A1 | 1/2003 | Lian et al. |
| 2003/0138986 | A1 * | 7/2003 | Bruner ................ B81C 1/00246 |
| | | | 438/52 |
| 2009/0108381 | A1 * | 4/2009 | Buchwalter ........... B81C 1/0023 |
| | | | 257/415 |
| 2010/0078753 | A1 * | 4/2010 | Mehregany ........... G01F 1/6888 |
| | | | 257/467 |
| 2011/0024850 | A1 | 2/2011 | Wang et al. |
| 2011/0248374 | A1 | 10/2011 | Akin et al. |
| 2012/0056308 | A1 * | 3/2012 | Perruchot ........... B81C 1/00666 |
| | | | 257/618 |
| 2012/0205754 | A1 * | 8/2012 | Iwamoto .................. H03H 3/02 |
| | | | 257/415 |
| 2014/0042563 | A1 | 2/2014 | Lander et al. |

OTHER PUBLICATIONS

Wojciechowski, K.E. et al., "Single-Chip Precision Oscillators Based on Multi-Frequency, High-Q Aluminum Nitride MEMS Resonators", IEEE Transducers Conf., Jun. 2009, pp. 2126-2130.

* cited by examiner

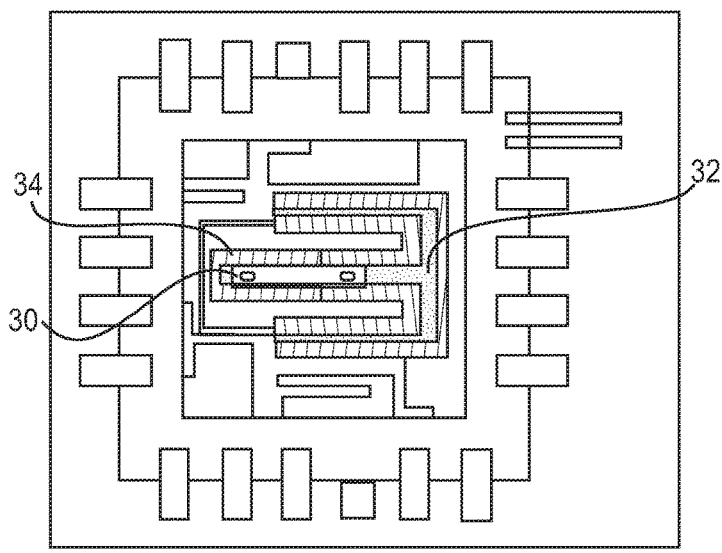
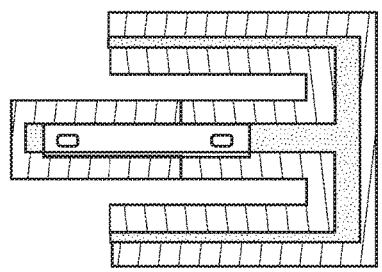
*FIG. 10A*  *FIG. 10B*
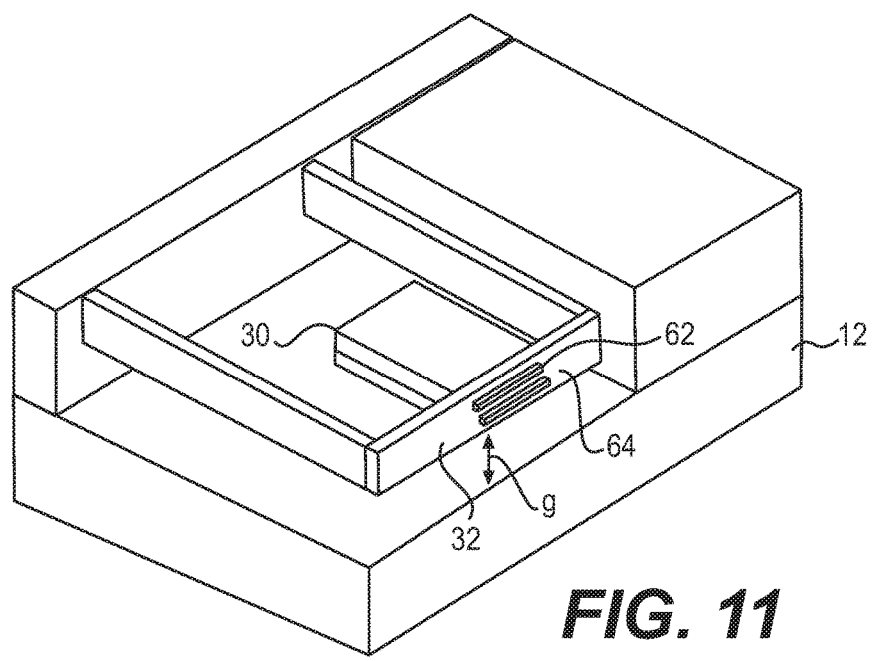
*FIG. 11*

METHOD OF MAKING THERMALLY-ISOLATED SILICON-BASED INTEGRATED CIRCUITS

CROSS-REFERENCE TO RELATED APPLICATION

This application is a divisional of prior U.S. application Ser. No. 13/959,136, filed Aug. 5, 2013, which is incorporated herein by reference in its entirety.

GOVERNMENT LICENSE RIGHTS

This invention was developed under Contract DE-AC04-94AL85000 between Sandia Corporation and the U.S. Department of Energy. The U.S. Government has certain rights in this invention.

INTRODUCTION

Many of today's electronic integrated circuit arrangements rely on precision analog components and/or reference levels that may be affected by fluctuations in operating temperature. In particular, arrangements such as precision A/D converters, voltage-controlled oscillators, analog delay lines, inertial sensors, gyroscopes and the like require temperature control in order to properly function. Techniques such as feedback control, device matching and laser/digital trimming have been able to control temperature-based variations to a degree. However, temperature drift remains a limiting factor in the overall performance of many of these devices.

Various solutions have been suggested to address the problems associated with temperature drift. For silicon-based circuits, creating "thermally isolated" structures has been studied. However, the existing method for creating such structures has its disadvantages. For example, the existing method relies upon a specific hybrid dry-and-wet electrochemical etch process that limits its flexibility and requires the use of a monocrystalline silicon substrate of a specific crystallographic orientation.

SUMMARY

The present invention overcomes limitations of the prior art by, among other things, using an etching process to create a gap between an integrated circuit and a portion of an underlying silicon-based substrate. The gap functions to release the integrated circuit from the substrate, thereby creating a thermally-isolated arrangement where the integrated circuit may be suspended above the silicon-based substrate. The phrase "silicon-based substrate" is intended to include any suitable type of substrate used in the fabrication of integrated circuits, including without limitation, silicon on insulator (SOI) substrates, pure silicon substrates (e.g., both monocrystalline and polycrystalline), as well as other structures including at least one silicon layer within which regions of an integrated circuit may be formed.

In accordance with an embodiment of the present invention, a first etch may be performed through a front side of a silicon-based substrate that has been populated with integrated circuits. The silicon-based substrate may be patterned and then etched such that dielectric material between the as-formed integrated circuits may be removed. A second, controlled etch of the silicon-based substrate may then be performed such that exposed surface regions of the silicon-based substrate, as well as a portion of the substrate underlying a defined integrated circuit, may be removed. Removal of the silicon material from underneath the integrated circuit forms a gap between the remaining substrate and the integrated circuit. In a further embodiment, the integrated circuit remains connected to the structure by a support bar, as described in detail below. The formation of this gap functions to release the integrated circuit from the silicon-based substrate and creates a thermally-isolated integrated circuit, where the integrated circuit is suspended over the remaining portion of the silicon-based substrate.

In slightly more detail, one exemplary method may comprise fabricating a thermally isolated integrated circuit. Such a method may comprise the steps of: a) providing a silicon-based substrate within which integrated circuits may be formed; b) fabricating at least one integrated circuit (e.g., a complementary metal oxide semiconductor (CMOS)-based device) incorporating a region of the silicon-based substrate, the at least one integrated circuit comprising an interlevel dielectric layer formed over the silicon-based substrate; c) patterning a top surface of the interlevel dielectric layer to define boundaries around at least one integrated circuit to be thermally isolated, the patterning also defining a support bar for maintaining physical contact with the at least one integrated circuit; d) etching a structure resulting from step c) to remove exposed regions of the interlevel dielectric layer, and exposing the silicon-based substrate; and e) removing a portion of the silicon-based substrate exposed in step d) by an etching process that releases the integrated circuit from the silicon-based substrate, while maintaining connection between the integrated circuit and the silicon-based substrate through at least a portion of the support bar.

The thermally isolated integrated circuit may include one or more devices selected from the group consisting of diodes, capacitors, transistors, resistors and inductors, for example.

In alternative embodiments the method may additionally comprise one or more of the following steps: performing step a) using a silicon-on-insulator (SOI) substrate; performing step d) using an etchant that results in creating a high aspect ratio opening in the interlevel dielectric layer; and performing step e) using an isotropic silicon etchant.

Another exemplary method may comprise fabricating a thermally isolated integrated circuit and resonator combination. Such a method may comprise the steps of: a) providing a silicon-based substrate; b) fabricating at least one integrated circuit comprising a region of the silicon-based substrate, the at least one integrated circuit comprising an interlevel dielectric layer formed over the silicon-based substrate; c) forming a silicon release layer on a top surface of the interlevel dielectric layer at a location over the at least one integrated circuit; d) depositing an isolation layer over remaining, exposed surface of the interlevel dielectric layer and the silicon release layer; e) depositing a conductive layer over a structure resulting from step d) and patterning the conductive layer to create a lower electrode; f) depositing a piezoelectric layer over a structure resulting from step e), the piezoelectric layer providing resonance properties; g) depositing a conductive layer over a structure resulting from step f) and patterning the conductive layer to create an upper electrode; h) patterning a top surface of a structure resulting from step g) wherein the patterning is performed so as to define (1) a resonator formed by the combination of the lower electrode, piezoelectric layer and the upper electrode, (2) boundaries around at least one integrated circuit to be thermally isolated and (3) a support bar region to be further processed to provide a support bar; i) etching piezoelectric material exposed by the patterning in step h), the etching terminating upon exposure of portions of the silicon release layer, then removing exposed portions of the silicon release layer; j) etching a structure resulting from step i) to remove exposed regions of the interlevel dielectric layer and a buried oxide insulating layer, exposing the silicon-based substrate; and k) etching a structure resulting from step j) to remove the remainder of the silicon release layer to isolate the resonator from the silicon-based substrate, the etching also removing a portion of the exposed silicon-based substrate sufficient to release the integrated circuit from the silicon-based substrate, with the support bar maintaining physical contact between the integrated circuit and the silicon-based substrate, creating a suspended structure that provides thermal isolation for the combination of the integrated circuit and the resonator.

In alternative embodiments, the substrate may be a silicon-on-insulator (SOI) substrate. Further, the just-described method may additionally comprise one or more of the following steps: performing step c) by depositing an amorphous silicon layer; performing step f) by depositing a layer of aluminum nitride; and performing steps e) and g) by depositing aluminum contact layers.

In addition to inventive methods the present invention also provides for inventive devices. In one embodiment an inventive device may comprise a thermally-isolated integrated circuit. As used herein, the terms "integrated circuit" "IC", and "device" will refer to a functional portion of an integrated circuit. Continuing, such an integrated circuit may comprise: at least one region integrated with a silicon-based substrate; a gap formed within the silicon-based substrate underneath the at least one region of the integrated circuit so as to release the integrated circuit from the silicon-based substrate; and a support bar formed in a predetermined area of the silicon-based substrate to maintain physical contact between the silicon-based substrate and the integrated circuit, creating a suspended, thermally isolated integrated circuit.

In alternative embodiments the invention may comprise a CMOS integrated circuit formed of one or more devices selected from the group consisting of diodes, capacitors, transistors, resistors and inductors (all of which may be integrated circuits), as well as various combinations of these devices which may also be integrated circuits.

In yet another embodiment of the present invention, a separate electronic device such as a resonator, oscillator, or the like may be combined with a thermally-isolated integrated circuit to create an arrangement where the separate electronic device may be thermally isolated from all remaining elements as well. For example, an inventive thermally isolated integrated circuit may comprise a resonator formed over an integrated circuit, and separated from the circuit to provide thermal and mechanical isolation for the resonator.

Other embodiments and aspects of the present invention will become apparent during the course of the following discussion.

BRIEF DESCRIPTION OF THE DRAWINGS

Referring now to the drawings,

FIG. 10a is a top view of an exemplary device formed in accordance with embodiments of the present invention, while FIG. 10b is an enlarged view of an element depicted in FIG. 10a;

FIG. 11 is an isometric side view of an exemplary device in accordance with an embodiment of the present invention illustrating a cantilevered arrangement where the device is suspended over, and isolated from, an underlying silicon-based substrate, with a support bar arrangement used to maintain physical contact between the device and the substrate.

DETAILED DESCRIPTION, INCLUDING EXAMPLES

Throughout the following description and drawings, like reference numbers/characters refer to like elements. It should be understood that, although specific exemplary embodiments are discussed herein there is no intent to limit the scope of present invention to such embodiments. To the contrary, it should be understood that the exemplary embodiments discussed herein are for illustrative purposes, and that modified and alternative embodiments may be implemented without departing from the scope of the present invention.

It should be further noted that some exemplary embodiments may be described and claimed as a process or method (hereafter "method"). Though a method may be described and claimed as set of sequential steps, it should be understood that the steps may be performed in parallel, concurrently or simultaneously. In addition, the order of each step within a method may be re-arranged. A method may be terminated when completed, and may also include additional steps not necessarily described herein. A method may correspond to functions or processes completed by a physical system.

As used herein, the term "and/or" includes any and all combinations of one or more of the associated listed items. It should be understood that if an element is referred to, or depicted, as being positioned "over" another element it may be completely over the other element or substantially over the other element, unless otherwise specified or understood by the context of the description or drawings. As used herein, the singular forms "a," "an" and "the" are not intended to include the plural form unless the context clearly indicates otherwise.

Unless specifically stated otherwise the phrases "providing", "fabricating", "forming", "depositing", "patterning", "etching" and other similar method steps are steps in a method that may be performed by a hardware system that is operable to produce inventive integrated circuits, for example, and/or a system that has the capability of producing inventive integrated circuits using the specified method steps. Such a system may include one or more processors operable to execute instructions stored in one or more hardware memories to complete each method step.

As used herein, the term "embodiment" refers to an example of the present invention.

Figure 1:
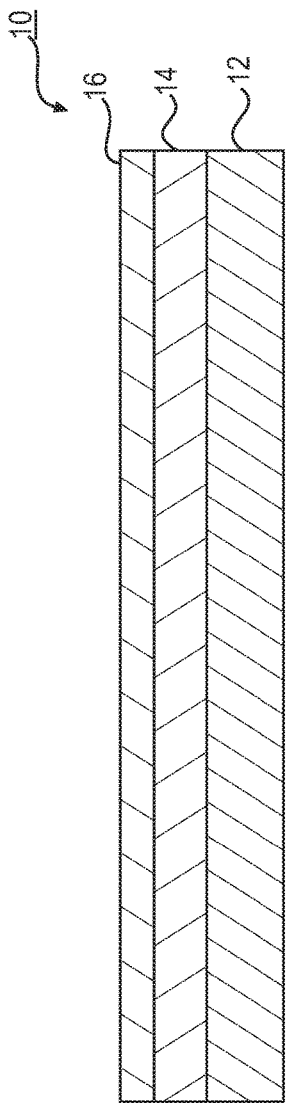
FIGS. 1-9 illustrate an exemplary set of steps associated with creating devices in accordance with embodiments of the present invention.

FIGS. 1-9 illustrate exemplary steps in a method of forming a thermally-isolated silicon-based integrated circuit in accordance with embodiments of the present invention. FIG. 1 depicts exemplary starting structure 10 for a specific integrated circuit. The structure 10 may comprise a portion of a SOI wafer 10. Many of today's integrated circuits (ICs) may be fabricated on an SOI wafer, using well-known CMOS fabrication techniques. While the methods of the present invention may take advantage of CMOS fabrication processes to create thermally stable integrated circuits, it should be understood that the specific integrated circuits depicted and described herein are exemplary only. Further, the methods, structures, devices and arrangements provided by the present invention may be formed within any suitable type of silicon-based substrate where it may be desirable to thermally isolate one or more specific integrated circuits from the remainder of an arrangement. Thus, while the following drawings and discussion may be directed to the use of an SOI structure, this description is intended as a non-limiting example.

As shown in FIG. 1, SOI wafer 10 is formed of a relatively thick, bulk silicon-based substrate 12 upon which a layer 14 of insulating material may be formed (generally, $SiO_2$ may be used to form layer 14). This layer may also be referred to in the art as a "buried oxide" layer, or BOX layer. A silicon surface 16 may be formed over BOX layer 14, where silicon surface 16 may be relatively thin (e.g., less than one micron), and may be used to form one or more regions of an integrated circuit), as described below.

Figure 2:
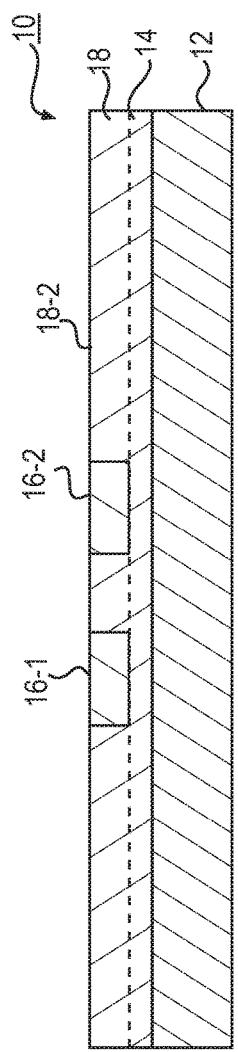

FIG. 2 shows the next step in an inventive, integrated circuit fabrication method. In particular FIG. 2 depicts the creation of separate "silicon islands" 16-1, 16-2, where various regions of integrated circuits may thereafter be formed. In the creation of these silicon islands, the starting structure (in this case, an SOI wafer) 10 of FIG. 1 may be patterned and then etched to remove portions of silicon surface layer 16 from areas where integrated circuits are not formed, leaving (in this example) the pair of silicon islands 16-1 and 16-2. In accordance with known fabrication processes, this structure may then be "planarized" by depositing additional insulating material 18 (usually $SiO_2$) so that upper surface 18-S of the structure may be flat (necessary for subsequent lithographic process steps used in integrated circuit formation).

Figure 3:
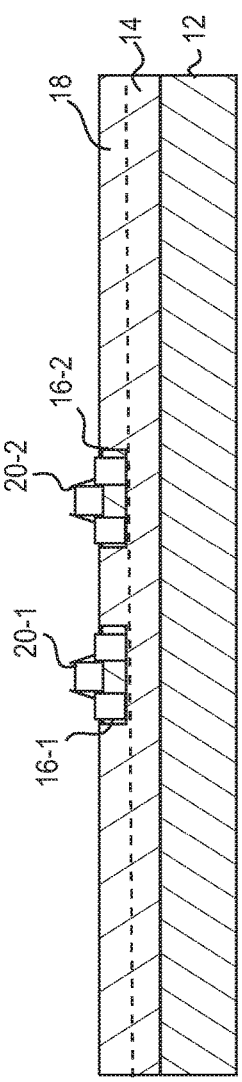
Figure 4:
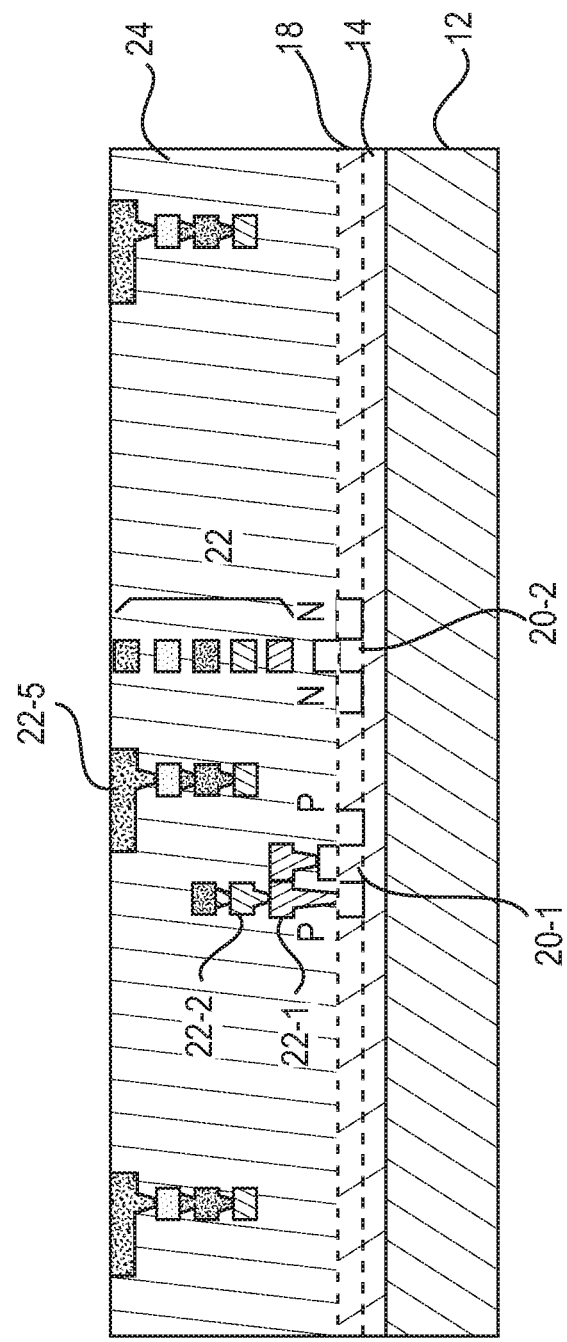

FIG. 3 shows a later step in the fabrication method, where a pair of integrated circuit devices 20-1 and 20-2 has been formed to include regions in silicon islands 16-1 and 16-2, respectively. Many different integrated circuits may be formed by embodiments of the invention, including, but not limited to, combinations of devices such as transistors, diodes, resistors, capacitors, etc. Once an integrated circuit is formed, electrical contacts are provided to various portions of the integrated circuit. A number of different metal "levels" may be used to create these contacts (as well as interconnections between specific devices), with an inter-level dielectric (ILD) material 24 used to provide electrical isolation among, and between, these different metal connections. FIG. 4 illustrates an exemplary SOI-based integrated circuit including a set of five separate metal interconnection layers 22, with ILD material 24 deposited between the various layers (e.g., between layer 22-1 and 22-2, between 22-2 and 22-3, and the like).

The structure as shown in FIG. 4 may be referred to as an example of a silicon-based integrated circuit for which thermal isolation in accordance with an embodiment of the present invention may be provided. It should be understood that the structure shown in FIG. 4 is exemplary only. Various other structures, which include fewer (or more) metal levels, various thicknesses of ILD, different types of devices, connections between devices, non-SOI silicon-based substrates, etc., are also within the scope of the present invention.

Figure 5:
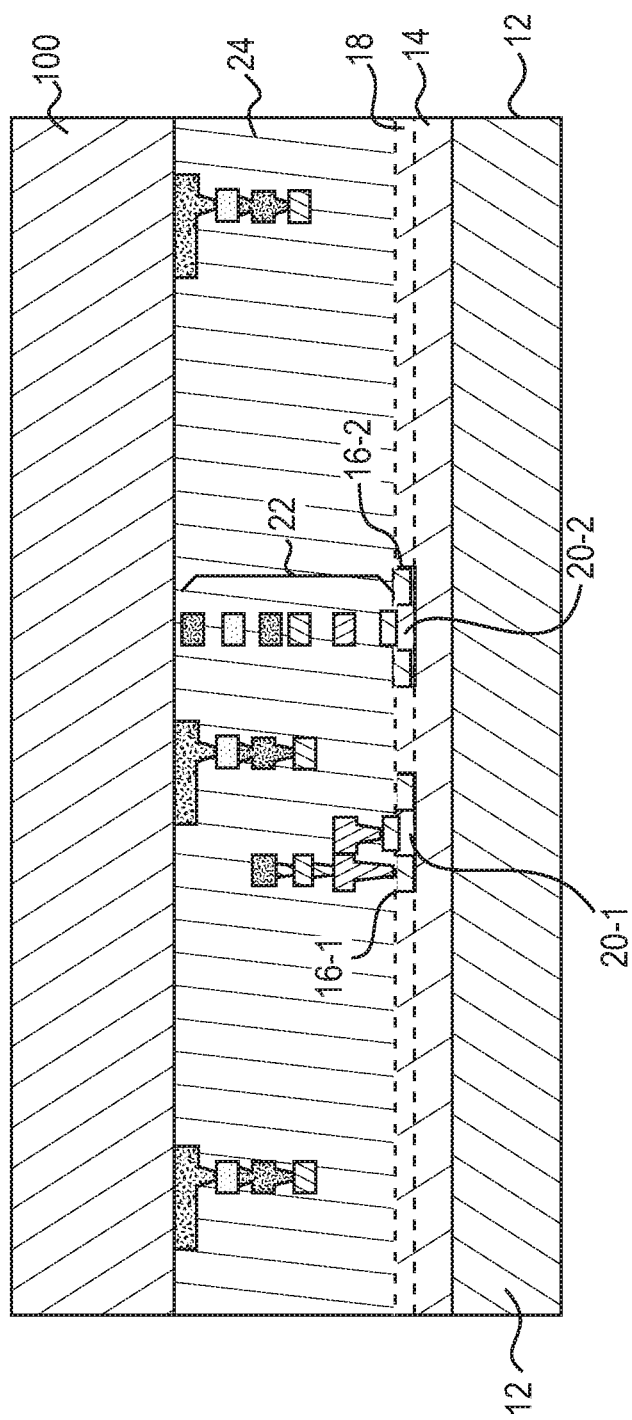
Figure 6:
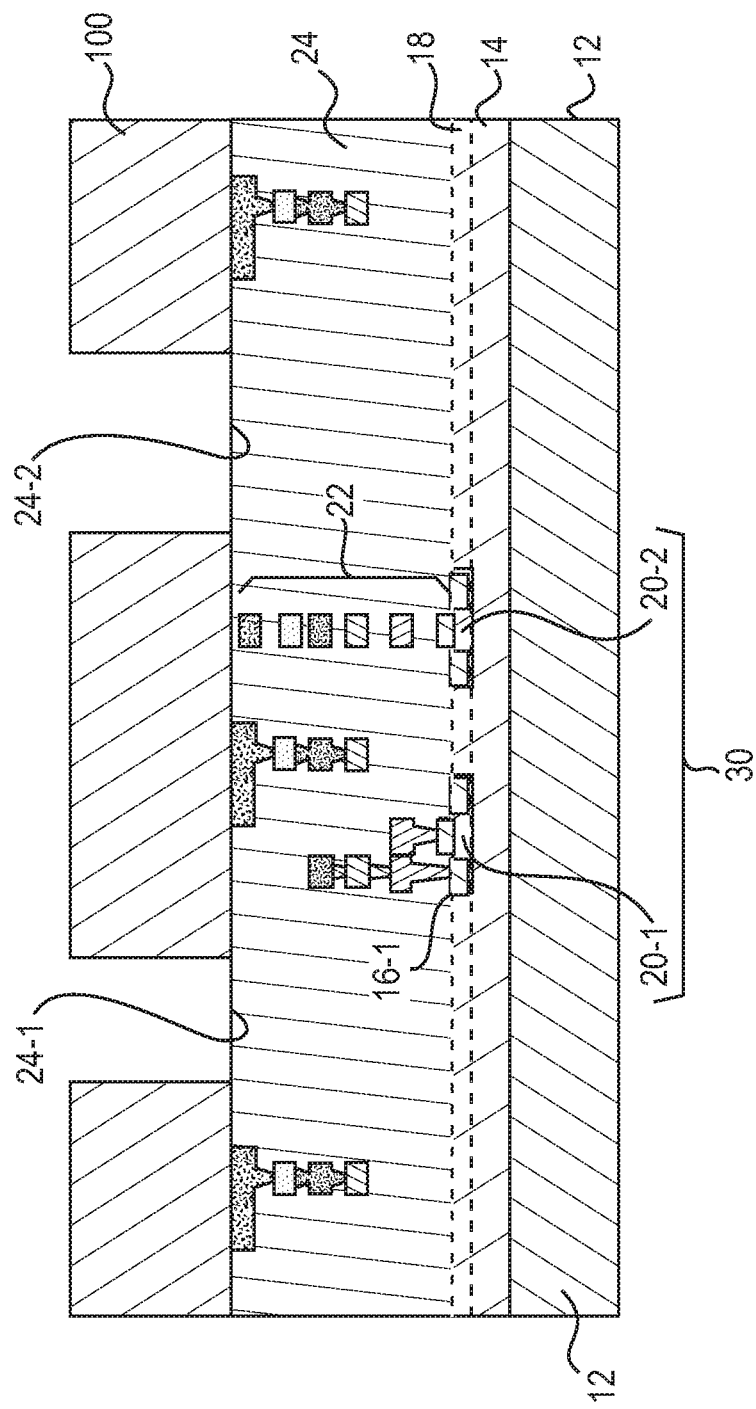
Figure 7:
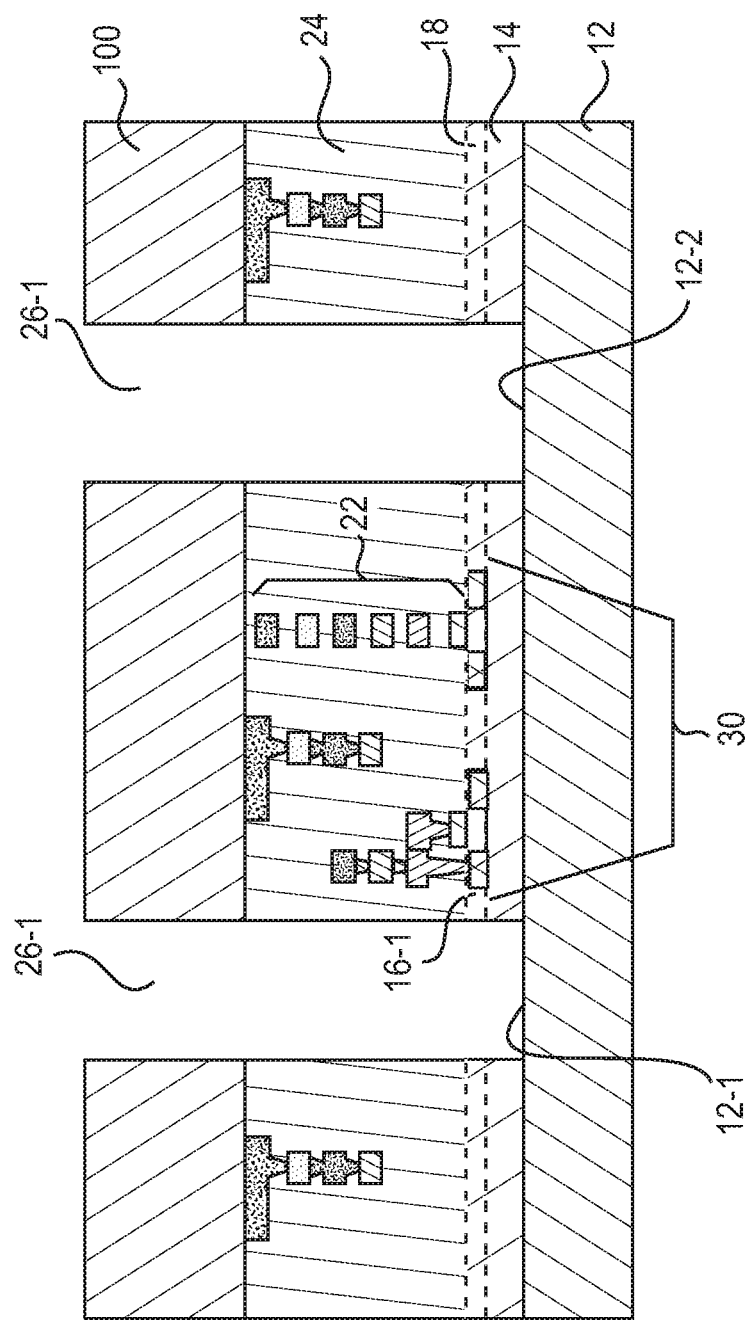

FIG. 5 shows an initial step in the formation of a thermally isolated integrated circuit in accordance with an embodiment of the present invention. As shown, the method may begin with the deposition of a layer of photoresist 100 over a top surface of the structure as shown in FIG. 5. Photoresist layer 100 may be then patterned, using well-known masking and photolithographic techniques, to define boundaries around each integrated circuit that is to be thermally isolated. Patterned photoresist layer 100 is then processed to expose regions 24-1 and 24-2 within ILD 24. The regions may be configured as thermal isolation boundaries for an integrated circuit 30 comprising the pair of devices 20-1 and 20-2. Following this step, an appropriate etching process is used to remove the exposed regions 24-1 and 24-2 of ILD material 24, as well as other dielectric layers below ILD material 24 (i.e., dielectric layers 18 and BOX layer 14). FIG. 7 shows the structure at this point in the method, particularly illustrating the formation of isolation trenches 26-1 and 26-2 surrounding integrated circuit 30. The silicon-based substrate 12 functions as an "etch stop" for this step in the method, where all dielectric material within each isolation trench 26 is removed, exposing surface regions 12-1 and 12-2 of substrate 12.

Figure 8:
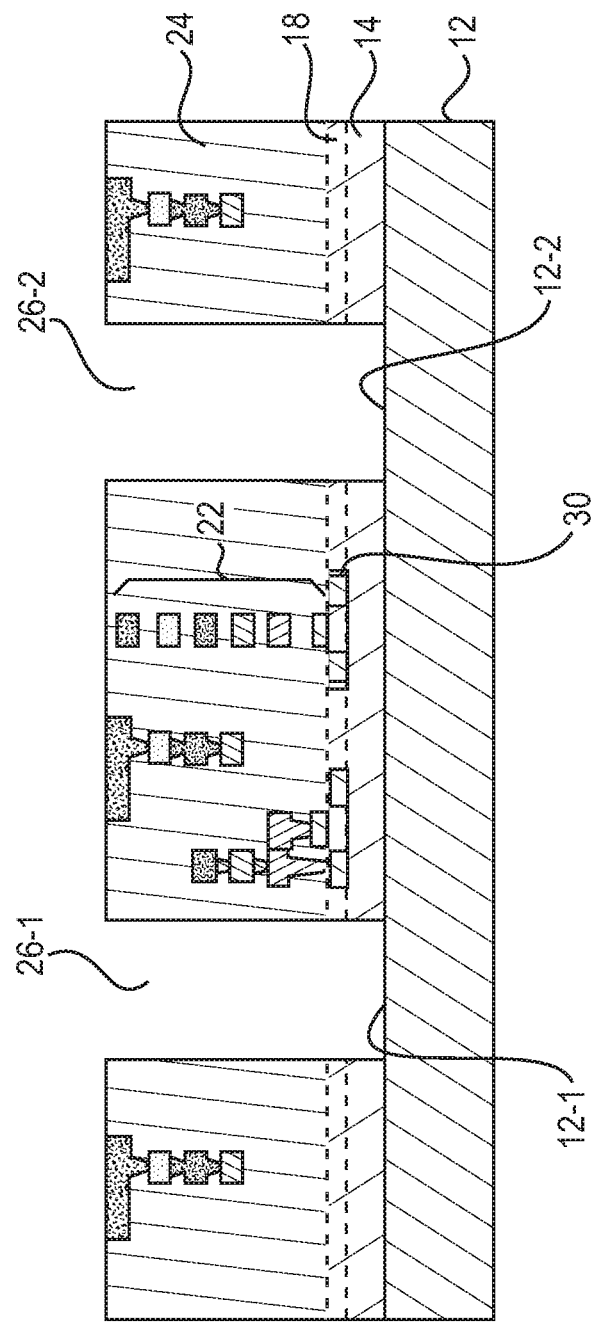

Following this step, all remaining portions of photoresist layer 100 may be removed, leaving a structure as shown in FIG. 8. At this point, only a final silicon etch may be required to form the thermally isolated structure. Advantageously, no additional patterning of the surface may be required, because the silicon etch may naturally occur within isolation trenches 26-1 and 26-2 formed during the previous step.

Figure 9:
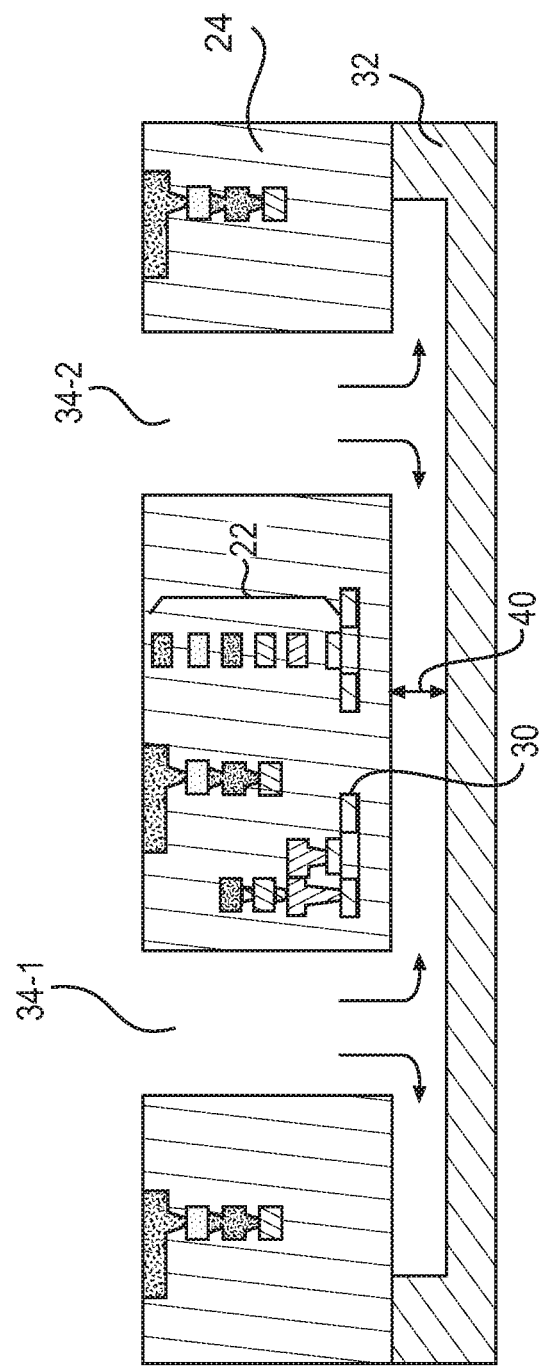

As mentioned above, a final silicon etch process may be used to remove silicon material in exposed regions 12-1 and 12-2, as well as a portion of silicon-based substrate 12 underlying integrated circuit 30. In accordance with embodiments of the present invention, and as shown in FIG. 9, an isotropic etching process may be used in the silicon removal step to remove silicon in both the "vertical", and "horizontal" directions, as shown by the arrows in FIG. 9. Indeed, the use of an isotropic etching process functions to remove a portion of the silicon-based substrate 12 underneath the region of silicon surface layer 18 where integrated circuit 30 is formed, thereby creating a gap 40 between integrated circuit 30 and the silicon-based substrate 12. This etching step functions to release the integrated circuit 30 from silicon-based substrate 12, where integrated circuit 30 is suspended above the remaining portion of silicon-based substrate 12.

The use of "front side" etching, as described herein, to create a thermally-isolated integrated circuit is considered to be an advancement over various prior art thermal isolation techniques that require an additional "back side" etch to remove regions of silicon-based substrate 12 to provide thermal isolation. The need (in the prior art) to etch both surfaces of the silicon-based substrate requires additional alignment steps, manufacturing processes, etc., all of which may be time-consuming and add expense to the circuit that is eventually formed.

FIG. 10a is a top view of an exemplary, thermally isolated integrated circuit 30 formed in accordance with an embodiment of the present invention. In this particular example the suspended integrated circuit 30 may be an ovenized (thermally stabilized) oscillator, such as a miniaturized version of an Oven Controlled Crystal Oscillators (OCXO). In accordance with this embodiment of the invention, the silicon etching process may be controlled such that a portion of the silicon material remains in physical contact with integrated circuit 30. This portion may be referred to as a support bar 32. Support bar 32 may be U-shaped as depicted in FIGS. 10a and b though this is just one of many shapes within the scope of the present invention. FIG. 10b depicts an enlarged picture of integrated circuit 30 and support bar 32. Support bar 32 may be used in accordance with embodiments of the present invention to provide a physical attachment that holds integrated circuit 30 suspended over silicon-based substrate 12. The specific geometry of support bar 32 may be determined by the geometry and operating characteristics of the specific integrated circuit to be isolated, as well as its location within the complete arrangement. Continuing, with reference to FIG. 10 the dark areas surrounding support bar 32 illustrate locations of thermal isolation trenches 34 formed around the periphery of integrated circuit 30.

FIG. 11 is an isometric view of integrated circuit 30, shown as suspended above silicon-based substrate 12 of SOI structure 10 in conjunction with support bar 32 in accordance with an embodiment of the invention. In one example, integrated circuit 30 may comprise a CMOS voltage reference circuit or band gap reference circuitry. A conventional band gap voltage reference circuit is known to exhibit a 180 parts per million (PPM) variation over a 180° C. temperature range. In comparison, in accordance with an embodiment of the invention, a band gap voltage reference formed as an inventive, thermally isolated structure (as shown in FIG. 10) has been found to be thermally stabilized and may exhibit a variation of only 10 parts per billion (PPB) over the same 180° C. temperature range.

Indeed, the thermal stability provided by methods of the present invention allow for the formation of various "ovenized" integrated circuits that, heretofore, have not been previously available. For example, there may be applications where it may be desirable to hold an electronic circuit at a constant temperature (generally an elevated temperature). In accordance with an embodiment of the present invention, the circuit and a heat source may be placed on a thermally isolated platform (i.e., forming an "oven") with the temperature on the platform set to remain at a specific, tightly-controlled value. By combining thermal isolation with the temperature stability of an ovenized configuration, the present invention makes it possible to form integrated circuits with orders of magnitude improvement in operational stability compared to existing devices, etc. For example, in the case where an inventive arrangement includes an oscillator the present invention makes it possible to realize frequency stabilities for the oscillator in the sub-PPB range.

FIG. 11 illustrates an ovenized configuration of integrated circuit 30. A heater resistor 62 and a temperature sensor (e.g., metal thermistor) 64 may be included within support bar 32, and used for temperature control of the thermally isolated integrated circuit 30 (e.g., an isolated band gap reference circuit, oscillator, or the like). Upon application of an externally-applied voltage across heater resistor 62, its temperature may increase, thus also increasing the temperature of integrated circuit 30. By virtue of its isolation from the remaining structure, the temperature of integrated circuit 30 is controlled (i.e., maintained or stabilized at a desired temperature) through the use of heater resistor 62, regardless of the ambient temperature of the complete structure.

The thermally isolated structures provided by the present invention may also be used to provide thermal stability to systems comprising integrated circuits combined with other devices, such as resonators, oscillators, etc. The ability to combine mechanical structures and electronics on a thermally-stabilized silicon-based substrate allows for the creation of systems that cannot otherwise be easily created. For example, systems such as oven controlled MEMS oscillators, thermally-stabilized accelerometers, gyroscopes, switchable filters, etc. may all be formed as thermally isolated systems in accordance with embodiments of the present invention.

Figure 12:
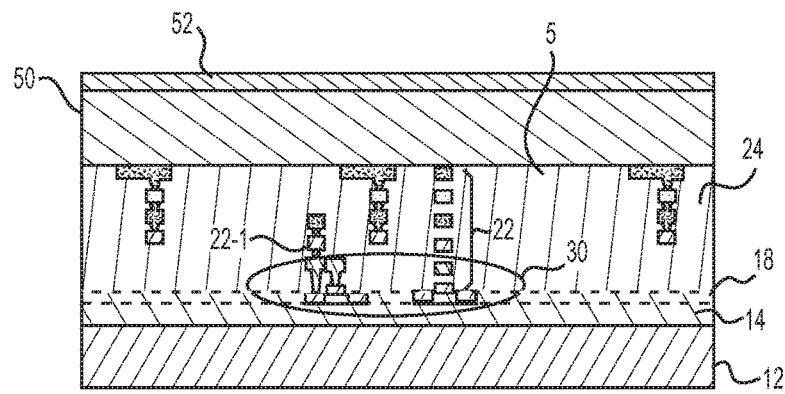
FIGS. 12-23 illustrate an exemplary set of steps associated with creating a combination of an integrated circuit and a separate electronic element in accordance with embodiments of the present invention.
Figure 13:
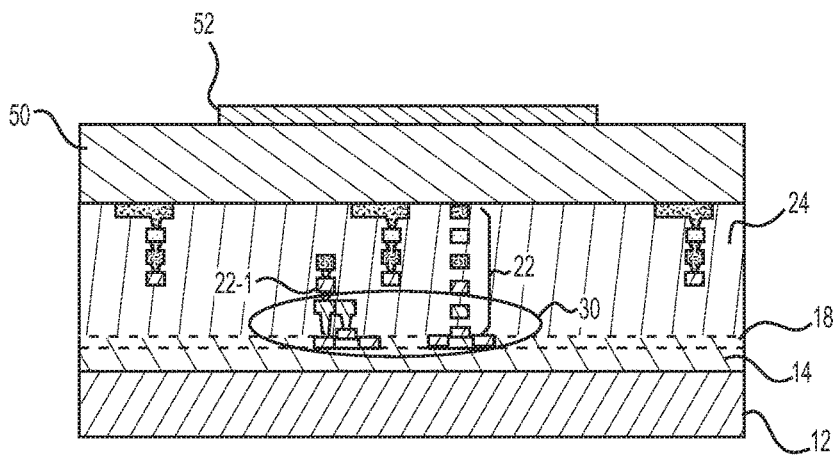
Figure 14:
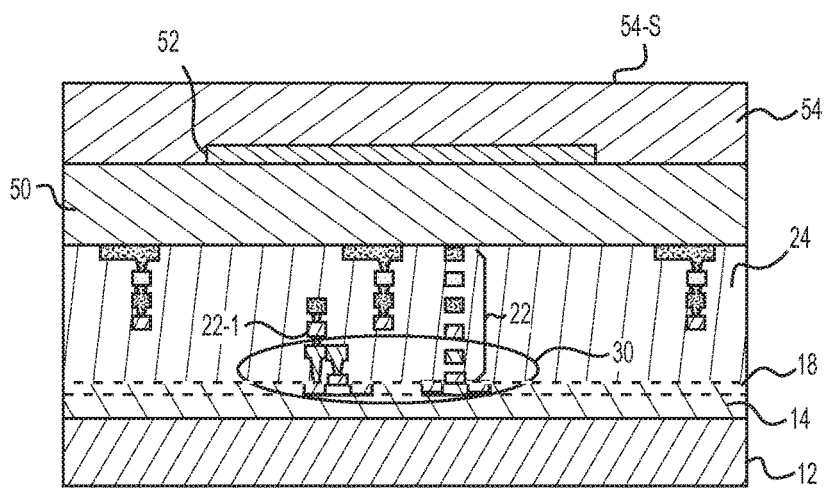

FIGS. 12-14 illustrate an exemplary method of forming one such thermally-stabilized system, in this case the combination of an integrated circuit and a set of aluminum nitride (AlN) resonators. The addition of the resonators requires a re-ordering of some of the steps described above, specifically, requiring the release of integrated circuit 30 from the silicon-based substrate 12 only after AlN resonator structures have been formed.

With particular reference to FIG. 12, an SOI-based integrated circuit as shown in FIG. 4 may be used as starting point for combining AlN resonators with an integrated circuit to form a thermally-stabilized system in accordance with an embodiment of the present invention. As shown in FIGS. 12-14, the structure of FIG. 4 may be initially processed to create a layer that may function to provide a gap (i.e., release) between the integrated circuit and the resonators formed on top of the integrated circuit. In particular, and with reference to FIG. 12, an oxide layer 50 is deposited over surface S of the SOI-based integrated circuit structure shown in FIG. 12. A relatively thin silicon release layer 52 may be then deposited over oxide layer 50. In embodiments, a preferable silicon layer 52 may comprise an amorphous silicon (a-silicon) material that, is deposited, for example, via a low temperature process.

Next, silicon release layer 52 may be patterned and etched to define the region where subsequent AlN resonators may be formed. That is, the silicon material outside of the boundary of the resonators may be removed. FIG. 13 shows the structure at this point in the fabrication method. A planarization process may then be performed to re-create a "flat" working surface across the top of the structure. For example, and as shown in FIG. 14, an additional oxide layer 54 may be deposited over both oxide layer 50 and the exposed surfaces of silicon release layer 52. If need be, a polishing step may be used to re-planarize top surface 54-S of oxide layer 54.

Figure 15:
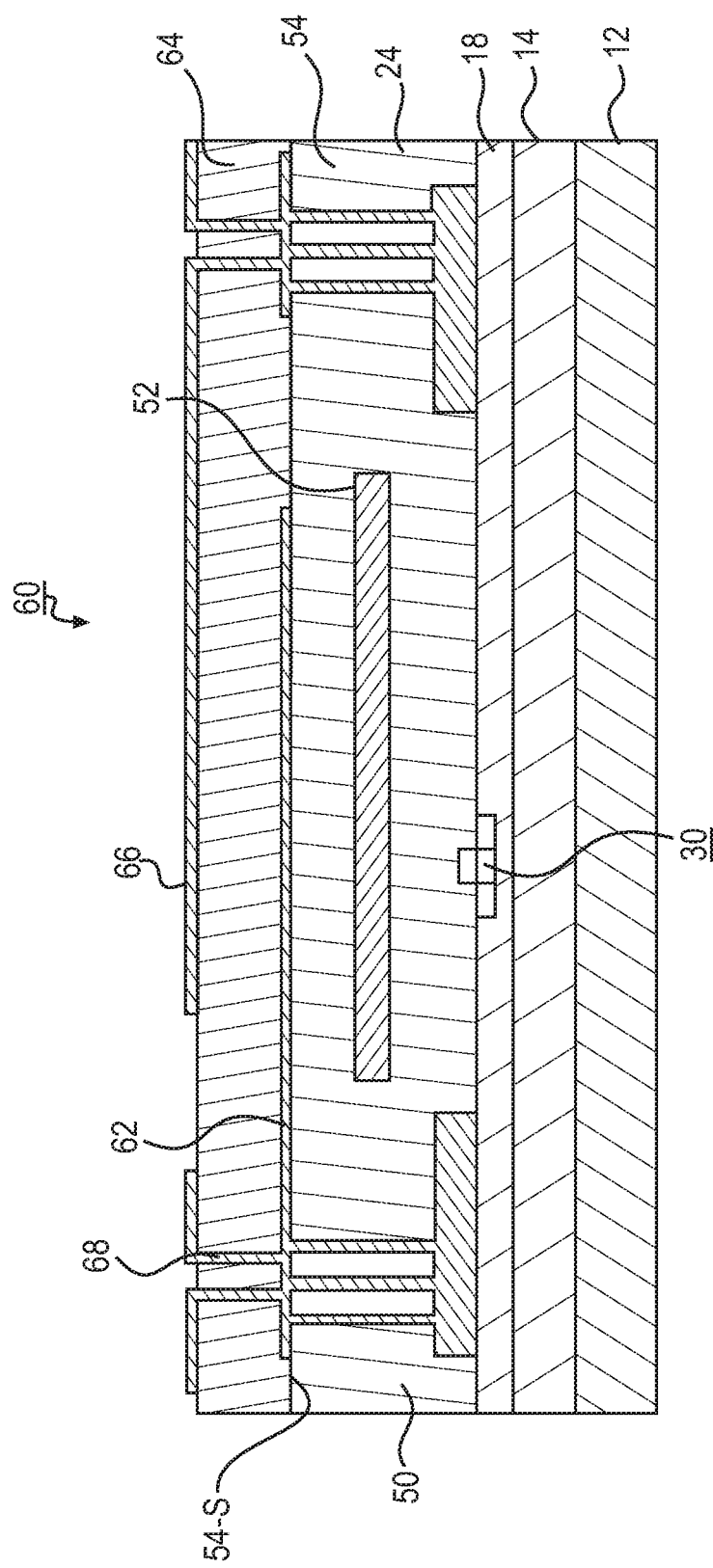

FIG. 15 illustrates an exemplary structure that has been processed to include an AlN resonator 60 with the planarized structure of FIG. 14. As shown, AlN resonator 60 may be created by first forming a lower electrode structure 62 on top surface 54-S of dielectric layer. In this particular structure, an aluminum material may be used to form lower electrode 62. A layer 64 of piezoelectric material (in this case, AlN) may then be deposited to cover both the exposed portions of oxide layer 54 and electrode structure 62. An upper electrode structure 66 (also, perhaps, formed of aluminum) may then be created on surface 64-S of piezoelectric layer 64. As understood by those in the art, a plurality of conductive vias 68 (in this case also aluminum) may be formed through the thickness of layer 64 in appropriate locations to provide electrically conductive pathways for the overall structure, defining a complete structure of AlN resonator 60. At this point, the boundaries of AlN resonator may be defined by patterning and etching through AlN layer 64, as shown in FIG. 16, to create boundary trenches 69.

Figure 17:
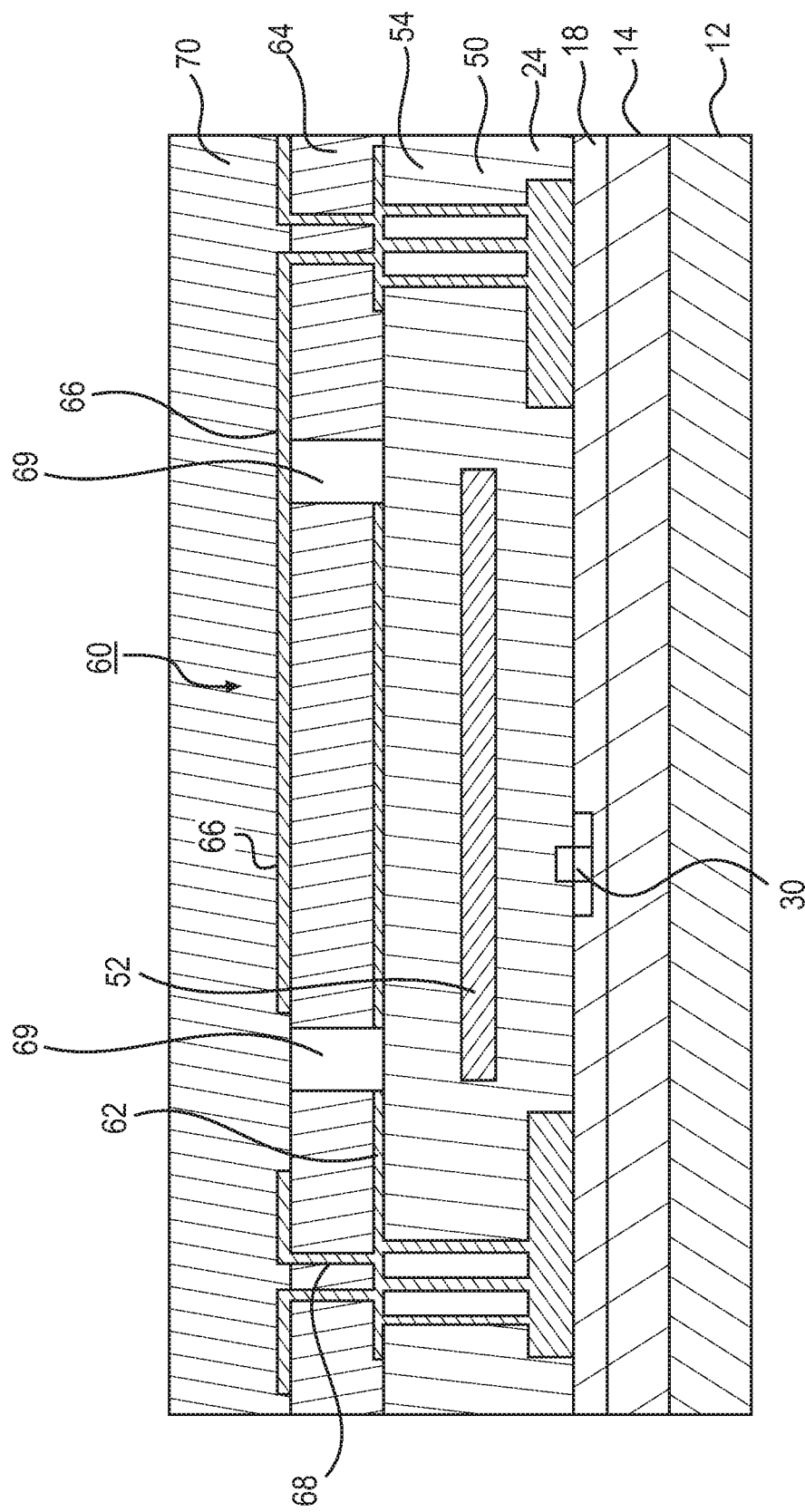

Once this point in the fabrication method has been reached, further steps related to creating a thermally-stabilized system may be performed. As shown in FIG. 17, the thermal isolation process may begin with depositing a layer 70 of photoresist material, where this material may be deposited to completely cover upper electrode structure 66, piezoelectric layer 64 and exposed portions of oxide layer 54 (again, photoresist layer 70 may be usually "planarized" to allow for proper alignment of patterning and etching steps).

Figure 18:
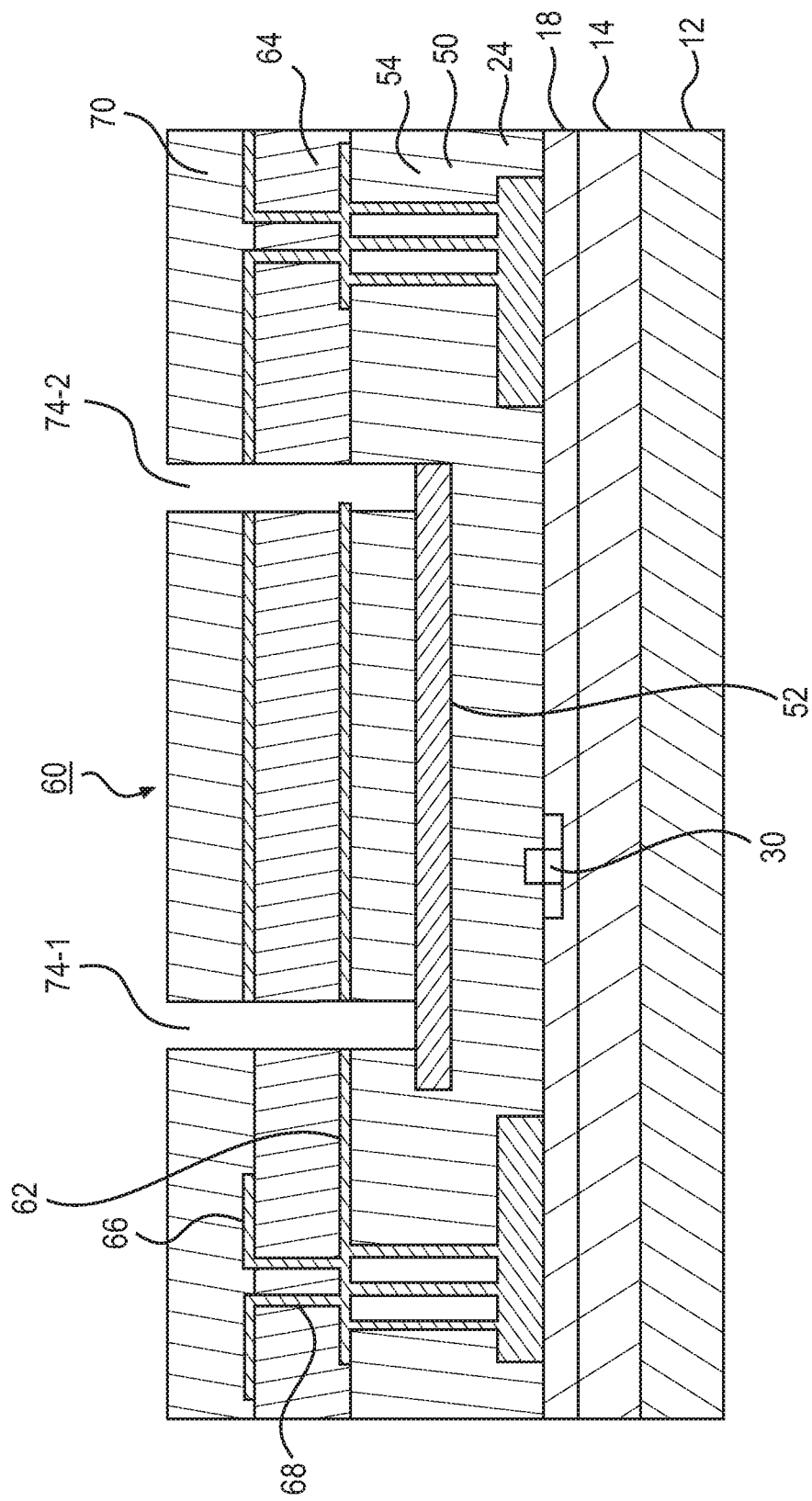

Referring to FIG. 18, photoresist layer 70 may be subsequently patterned and exposed, removing the photoresist material in selected areas to create windows 72-1 and 72-2.

Figure 16:
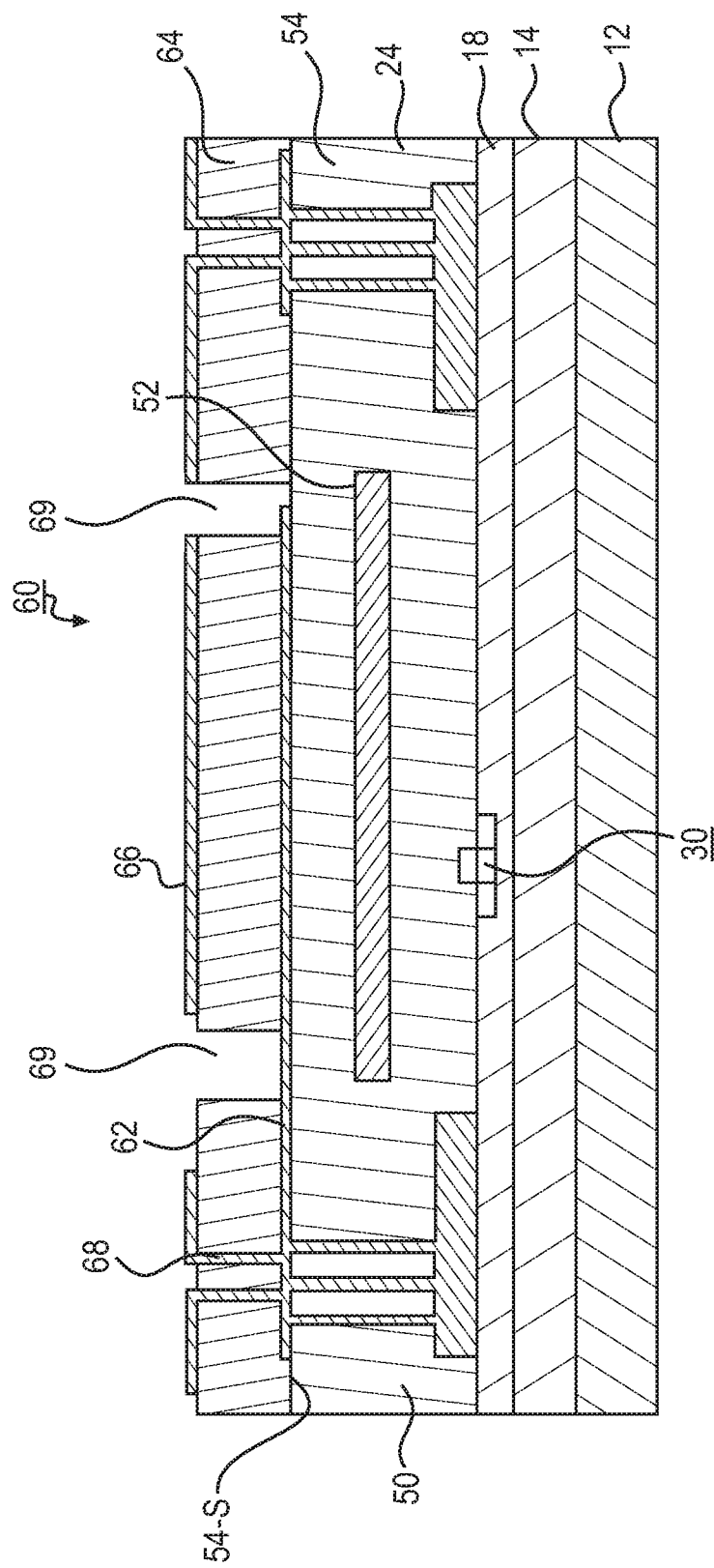

As shown, these windows may be located at boundary locations associated with the known periphery (i.e., boundary trenches 69) of AlN resonator 60, as shown in FIG. 16. Since windows 72-1 and 72-2 may be devoid of any photoresist material, the underlying surface may be exposed.

An initial etch process may be used at this point to remove oxide layer 54. In accordance with an embodiment of the present invention, silicon release layer 52 may function as an "etch stop" for this step in the process. FIG. 18 illustrates the structure at this point in the process, showing the creation of trenches 74-1 and 74-2 that isolate AlN resonator 60 from the remainder of the circuitry formed on the SOI-based structure.

Once AlN resonator 60 has been isolated, a second series of steps may be used to provide thermal isolation of the underlying integrated circuit 30. While these steps may be similar to those described above in FIGS. 5-9, for the sake of completeness it is useful to continue with the description of the formation of the combined system.

Figure 19:
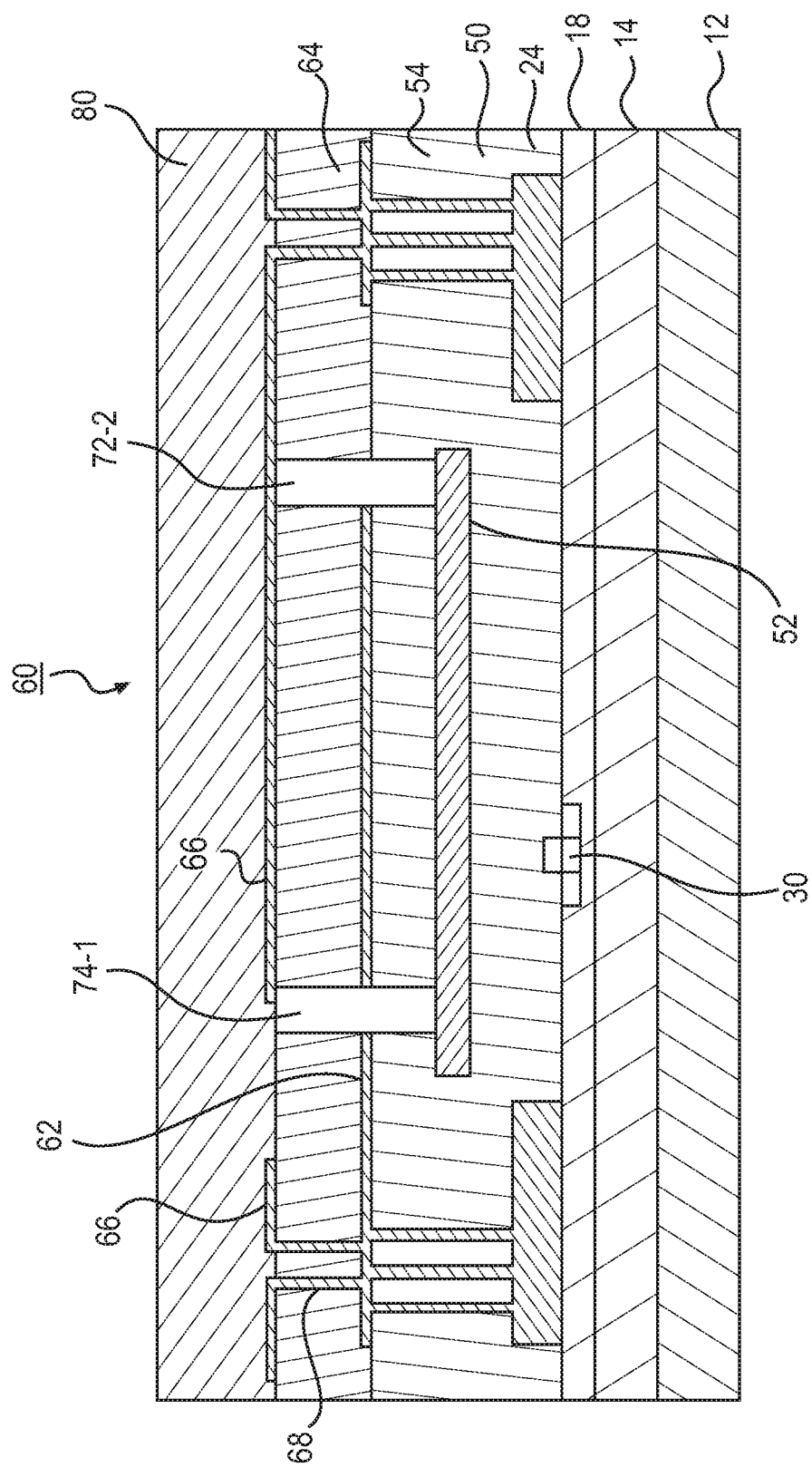
Figure 20:
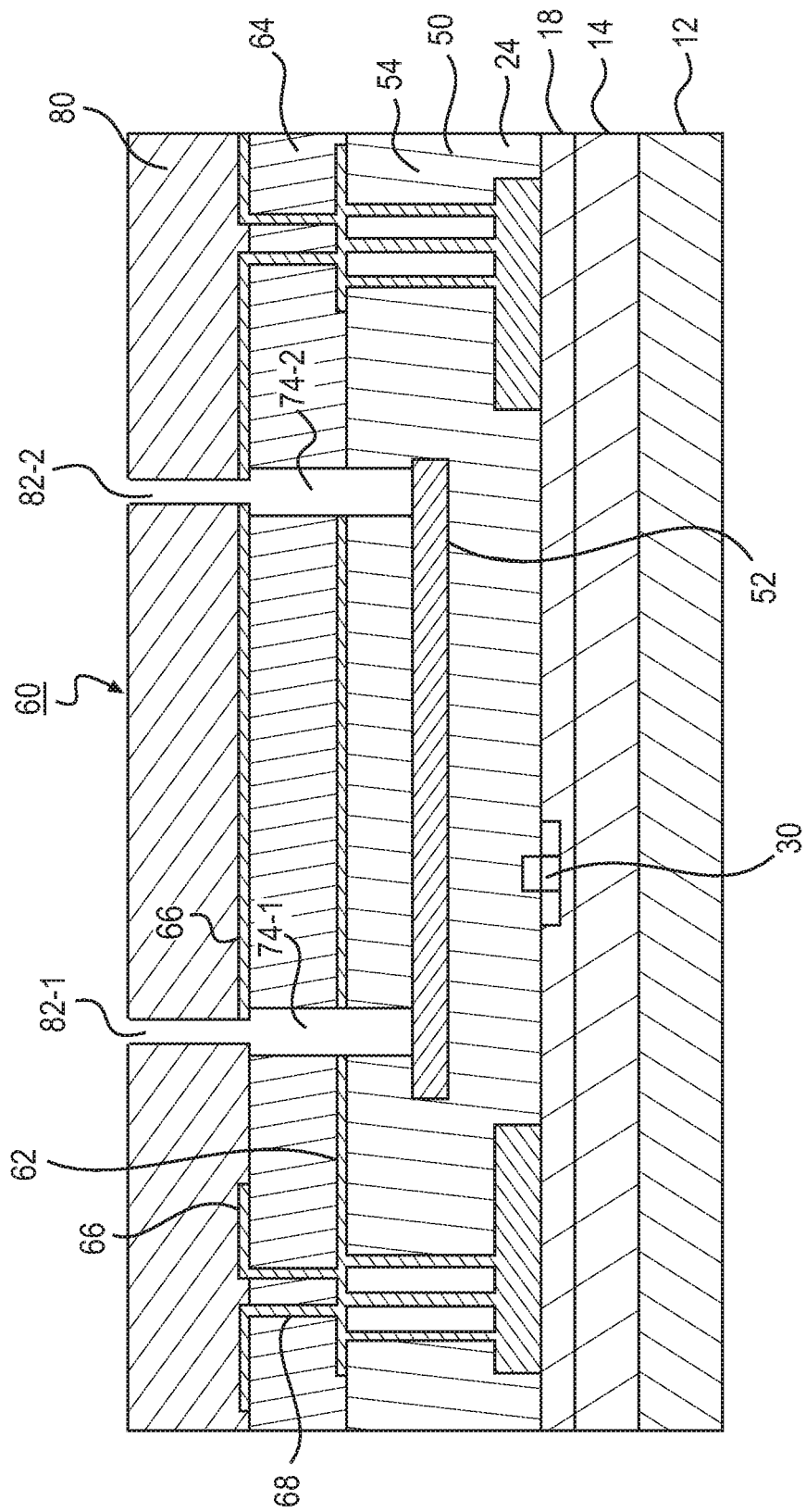

FIG. 19 illustrates an initial step in this second series of steps, where any remaining portions of photoresist layer 70 have been removed, and a fresh photoresist layer 80 has been deposited, completely covering the surface of the arrangement (including trenches 74-1 and 74-2). Photoresist layer 80 may be then patterned to define the isolation boundaries of integrated circuit 30. FIG. 20 illustrates an example of such a structure. As shown, windows 82-1 and 82-2 may be formed through photoresist layer 80 to expose the underlying trenches 74-1 and 74-2. In this example, windows 82-1 and 82-2 fall within the outer limits of underlying trenches 74-1 and 74-2, respectively.

Figure 21:
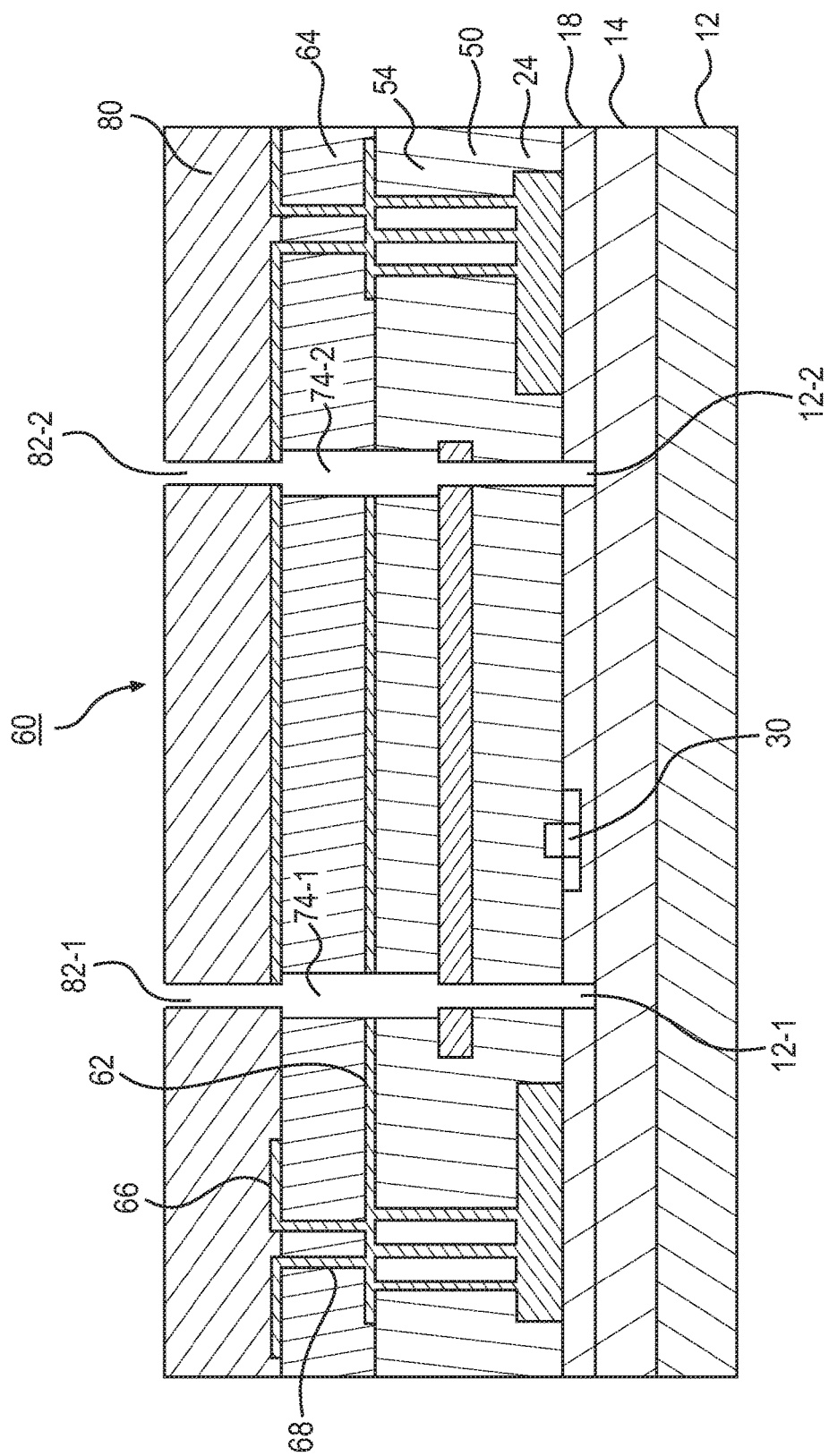

A well-controlled etch process (such as reactive ion etching (RIE) or any other suitable type of etching that creates an opening having a high aspect ratio in terms of etch depth with respect to etch width) may be then used to remove the exposed portions of silicon release layer 52, as well as oxide layers 24, 18 and 14. At this point, as shown in FIG. 21, selected surface regions 12-1 and 12-2 of silicon-based substrate 12 may be exposed.

Figure 22:
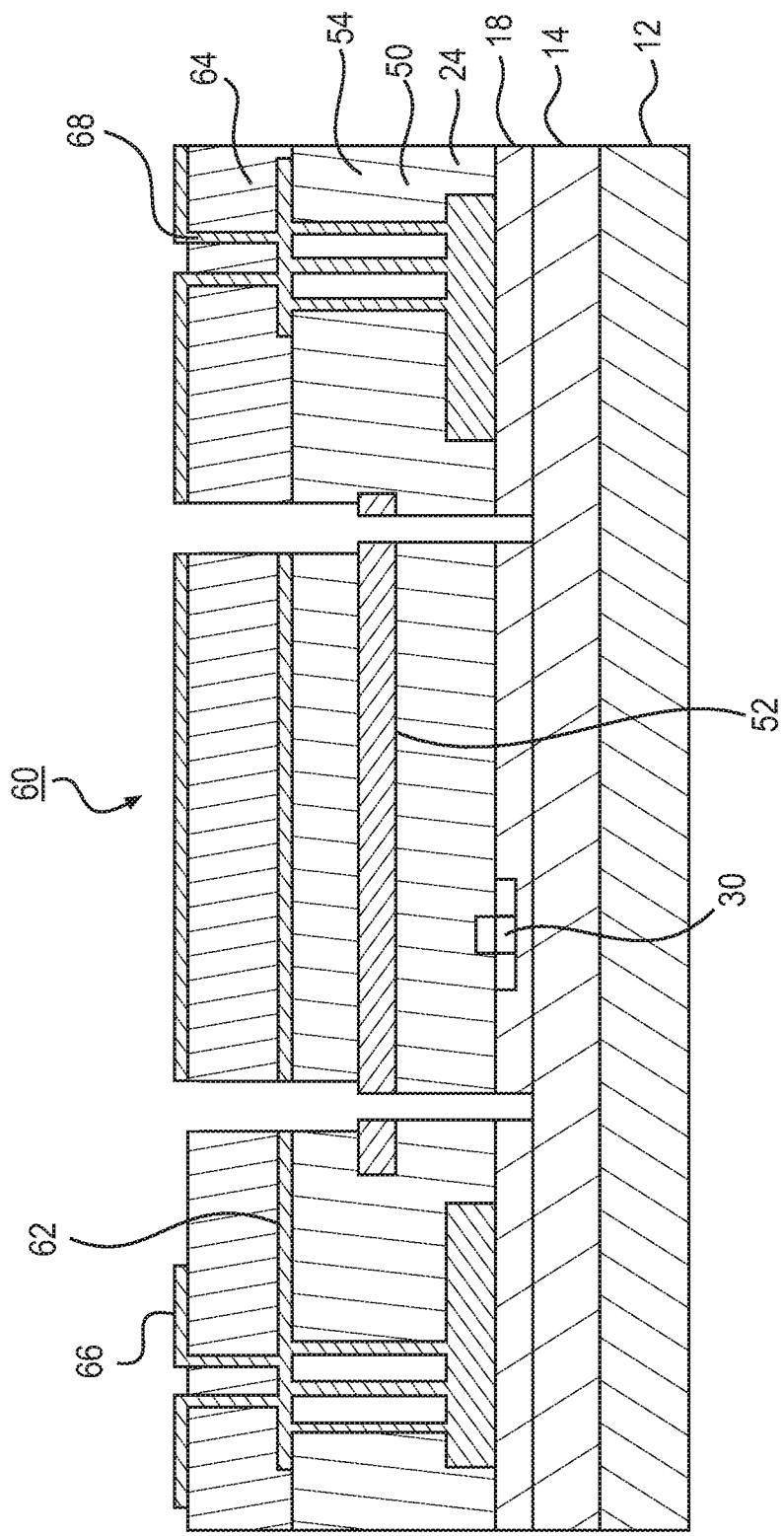

The remaining portions of photoresist layer 80 may be removed, resulting in the structure as shown in FIG. 22. As shown, integrated circuit 30 may still be attached to silicon-based substrate 12, and resonator 60 may remain attached to integrated circuit 30 via silicon release layer 52. A release of both the AlN resonator 60 and the integrated circuit 30 may then be performed to create a final, thermally-isolated system.

Figure 23:
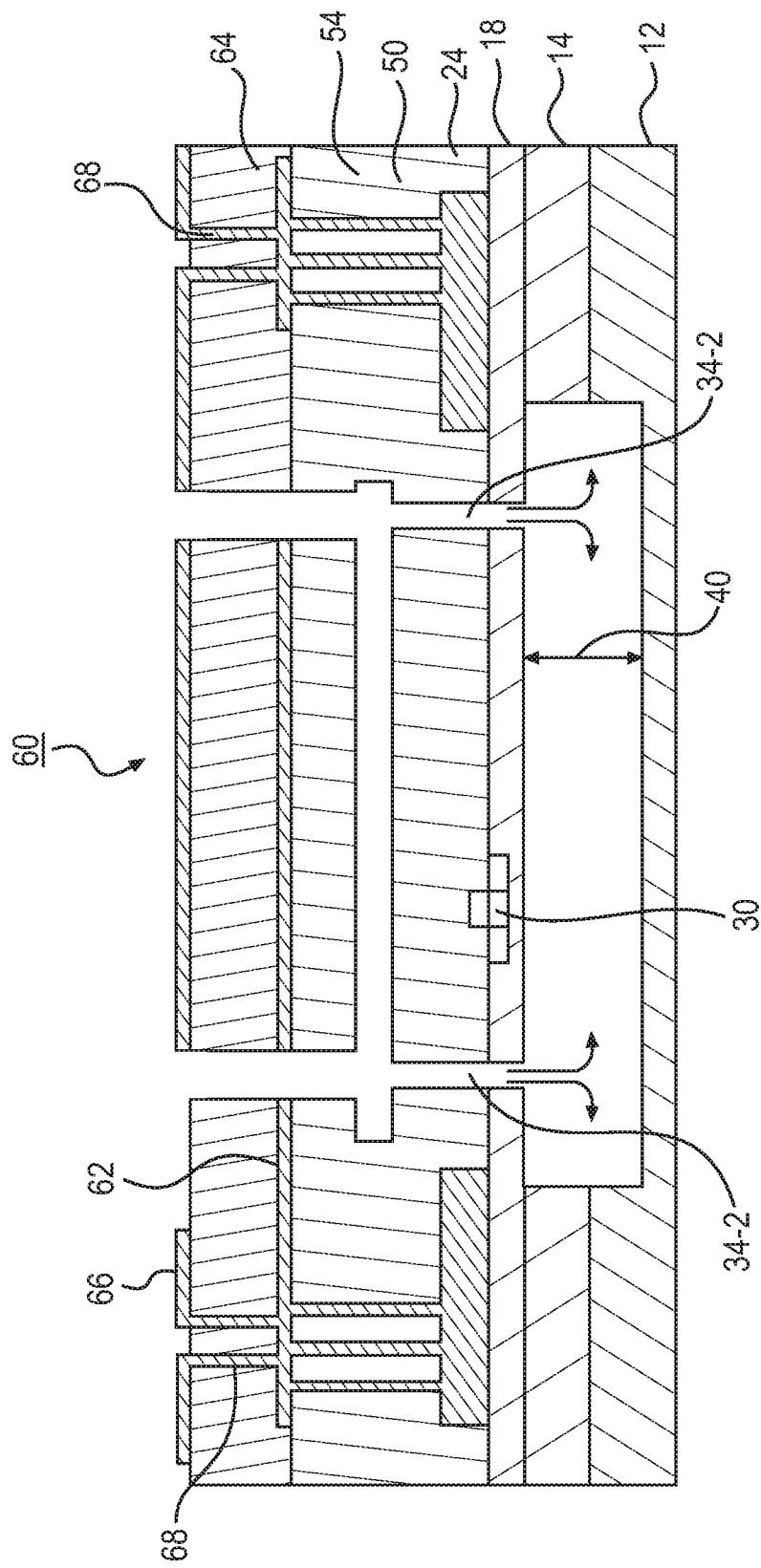

FIG. 23 illustrates a final, thermally-isolated system as formed in accordance with the above-described procedure of the present invention. As shown, an etching of the exposed silicon regions may be performed, including silicon release layer 52 and portions of silicon-based substrate 12. The removal of silicon release layer 52 creates a gap between AlN resonator and integrated circuit 30, which allows AlN resonator 60 to move with respect to the remainder of the circuitry. Additionally, as described above with FIG. 9, the use of an isotropic etchant may remove silicon in both the horizontal and vertical directions, creating thermal isolation trenches 34-1 and 34-2 as well as gap 40 in the horizontal direction underneath integrated circuit 30.

It is to be understood that the embodiments described above are exemplary only. Additional silicon-based, integrated circuit devices, and devices combined with other electronic elements may be formed, and thermally isolated from one another using the etching methods of the present invention. That said, the scope of the invention should be construed based on the appended claims.

What is claimed is:

1. A method of fabricating a thermally isolated integrated circuit and resonator combination, the method comprising the steps of:
   a) providing a silicon-based substrate;
   b) fabricating at least one integrated circuit comprising a portion of the silicon-based substrate, the at least one integrated circuit comprising an interlevel dielectric layer formed over the silicon-based substrate;
   c) forming a silicon release layer on a top surface of the interlevel dielectric layer at a location over the at least one integrated circuit;
   d) depositing an isolation layer over a remaining, exposed surface of the interlevel dielectric layer and the silicon release layer;
   e) depositing a conductive layer over a structure resulting from step d) and patterning the conductive layer to create a lower electrode;
   f) depositing a piezoelectric layer over a structure resulting from step e),
   g) depositing a conductive layer over a structure resulting from step f) and patterning the conductive layer to create an upper electrode;
   h) patterning a top surface of a structure resulting from step g), wherein the patterning of step h) is performed so as to define (i) a resonator formed by the lower electrode, piezoelectric layer and the upper electrode, (ii) boundaries around at least one region to be thermally isolated and (iii) a support bar region to be further processed to provide a support bar;
   i) etching piezoelectric material exposed by the patterning in step h), the etching terminating upon exposure of portions of the silicon release layer, then removing exposed portions of the silicon release layer;
   j) etching a structure resulting from step i) to remove exposed regions of the interlevel dielectric layer and a buried oxide insulating layer, exposing the silicon-based substrate; and
   k) etching a structure resulting from step j) to remove any remainder of the silicon release layer to isolate the resonator from the silicon-based substrate, the etching also removing a portion of the exposed silicon-based substrate sufficient to release the integrated circuit from the silicon-based substrate, with the support bar maintaining physical contact between the integrated circuit and the silicon-based substrate, creating a suspended structure.

2. The method as in claim 1, wherein in performing step f) a layer of aluminum nitride is deposited.

3. The method as in claim 1, wherein in performing step c) an amorphous silicon layer is deposited.

4. The method as in claim 1, wherein in performing steps e) and g), aluminum contact layers are deposited.

5. The method as in claim 1, wherein in performing step a), a silicon-on-insulator (SOI) substrate is provided.

* * * * *